(12) United States Patent
Ko et al.

(10) Patent No.: US 7,078,741 B2
(45) Date of Patent: Jul. 18, 2006

(54) ENHANCED PHOTODETECTOR

(75) Inventors: Cheng C. Ko, Ann Arbor, MI (US); Barry Levine, Livingston, NJ (US)

(73) Assignee: Picometrix, Inc., Ann Arbor, MI (US)

( * ) Notice: Subject to any disclaimer, the term of this patent is extended or adjusted under 35 U.S.C. 154(b) by 0 days.

(21) Appl. No.: 10/502,109

(22) PCT Filed: Feb. 3, 2003

(86) PCT No.: PCT/US03/03181

§ 371 (c)(1),
(2), (4) Date: Oct. 29, 2004

(87) PCT Pub. No.: WO03/065416

PCT Pub. Date: Aug. 7, 2003

(65) Prior Publication Data
US 2005/0056861 A1    Mar. 17, 2005

Related U.S. Application Data

(60) Provisional application No. 60/353,849, filed on Feb. 1, 2002.

(51) Int. Cl.
*H01L 31/109* (2006.01)
(52) U.S. Cl. ............... 257/185; 257/189; 257/191; 257/439; 257/463; 257/656
(58) Field of Classification Search ........ 257/184–185, 257/189, 191, 439, 461, 463, 655–656
See application file for complete search history.

(56) References Cited

U.S. PATENT DOCUMENTS 3,926,693 A * 12/1975 Kawamoto et al. ......... 438/380
4,046,609 A *  9/1977 Digoy ......................... 438/57

(Continued)

FOREIGN PATENT DOCUMENTS

WO    WO 03/065416    8/2003

(Continued)

OTHER PUBLICATIONS

Watanabe et al., IEEE Photonics Tehncology Letter 8, pp. 827-829, 1996.

*Primary Examiner*—Allan R. Wilson
(74) *Attorney, Agent, or Firm*—Brinks Hofer Gilson & Lione

(57) ABSTRACT

The present invention includes a photodiode having a first p-type semiconductor layer and an n-type semiconductor layer coupled by a second p-type semiconductor layer. The second p-type semiconductor layer has graded doping along the path of the carriers. In particular, the doping is concentration graded from a high value near the anode to a lower p concentration towards the cathode. By grading the doping in this way, an increase in absorption is achieved, improving the responsivity of the device. Although this doping increases the capacitance relative to an intrinsic semiconductor of the same thickness, the pseudo electric field that is created by the graded doping gives the electrons a very high velocity which more than compensates for this increased capacitance.

18 Claims, 2 Drawing Sheets

U.S. PATENT DOCUMENTS

| | | |
|---|---|---|
| 4,142,200 A * | 2/1979 | Mizushima et al. ........ 257/438 |
| 4,186,355 A * | 1/1980 | Lo ................................ 372/45 |
| 4,236,069 A | 11/1980 | Laughlin |
| 4,597,004 A | 6/1986 | Longeway et al. |
| 4,686,550 A | 8/1987 | Capasso et al. |
| 4,840,916 A | 6/1989 | Yasuda et al. |
| 4,887,134 A * | 12/1989 | Saito et al. .................... 257/55 |
| 5,016,073 A * | 5/1991 | Elliott et al. ................. 257/184 |
| 5,057,892 A * | 10/1991 | Iwanczyk .................... 257/461 |
| 5,146,296 A | 9/1992 | Huth |
| 5,179,430 A | 1/1993 | Torikai |
| 5,365,077 A | 11/1994 | Metzger |
| 5,539,221 A | 7/1996 | Tsuji et al. |
| 5,552,629 A | 9/1996 | Watanabe |
| 5,581,087 A * | 12/1996 | Uddin et al. ........... 250/370.11 |
| 5,654,578 A | 8/1997 | Watanabe |
| 5,818,096 A | 10/1998 | Ishibashi et al. |
| 6,081,019 A | 6/2000 | White |
| 6,107,652 A | 8/2000 | Scavennec et al. |
| 6,229,161 B1 | 5/2001 | Nemati et al. |
| 6,229,162 B1 | 5/2001 | Watanabe |
| 6,326,650 B1 | 12/2001 | Allam |
| 6,359,322 B1 | 3/2002 | Haralson et al. |
| 2002/0070384 A1 | 6/2002 | Clark et al. |
| 2003/0021322 A1 | 1/2003 | Steinle et al. |

FOREIGN PATENT DOCUMENTS

| | | |
|---|---|---|
| WO | WO 03/065417 | 8/2003 |
| WO | WO 03/065418 | 8/2003 |

* cited by examiner

ENHANCED PHOTODETECTOR

CROSS-REFERENCE TO RELATED APPLICATIONS

This application is a filing under 35 U.S.C. 371, which claims priority to International Application Serial No. PCT/US03/03181, filed Feb. 3, 2003, which claims the benefit of U.S. Provisional Application No. 60/353,849, filed Feb. 1, 2002.

FIELD OF THE INVENTION

The present invention relates to a semiconductor-based photodetector, and in particular to a high-speed, broad bandwidth photodetector having enhanced absorption characteristics.

BACKGROUND AND SUMMARY OF THE INVENTION

There is a well-known tradeoff between high speed and sensitivity in a photodetector. High bandwidth signal detection requires a short transit time of the carriers and thus a thin absorption layer. However, the geometrical constraints on the absorption layer thickness results in a reduced absorption and lower responsivity.

One type of semiconductor-based photodetector is termed a p-i-n junction diode, or a PIN diode. This type of structure is generally composed of a number of solid semiconductive sandwiched together in an epitaxial structure. In particular, a p-type semiconductor material and an n-type semiconductor region are separated by an intrinsic semiconductor.

In a PIN diode, the depletion layer extends into each side of junction by a distance that is inversely proportional to the doping concentration. Thus, the p-i depletion layer extends well into the intrinsic material, as does the depletion layer of the i-n junction. Accordingly, a PIN diode functions like a p-n junction with a depletion layer that encompasses the entirety of the intrinsic material. The primary advantages inherent to this structure are twofold. First, the addition of the intrinsic layer permits a fractional increase in the amount of light to be captured by the diode. Secondly, due to the extended depletion layer, the PIN diode has a very small junction capacitance and corresponding fast response.

Most attempts at increasing the speed of PIN diodes have focused on reducing the capacitance at the junction. At least one proposed design has included an undoped drift region for this purpose, effectively increasing the size of the intrinsic portion of the diode. Although this solution is suitable for decreasing the junction capacitance, it unfortunately increases the transit time for the carriers and thus reduces the response time of the photodetector. As such, there is a need in the art for an improved photodetector that strikes the proper balance between capacitance and response time, while increasing the responsivity of the device.

Accordingly, the present invention includes a photodiode having a first p-type semiconductor layer and an n-type semiconductor layer coupled by a second p-type semiconductor layer. The second p-type semiconductor layer has graded doping along the path of the carriers. In particular, the doping is concentration graded from a high value near the anode to a lower p concentration towards the cathode. By grading the doping in this way, an increase in absorption is achieved, improving the responsivity of the device. Although this doping increases the capacitance relative to an intrinsic semiconductor of the same thickness, the pseudo electric field that is created by the graded doping gives the electrons a very high velocity which more than compensates for this increased capacitance. Further embodiments and advantages of the present invention are discussed below with reference to the figures.

DETAILED DESCRIPTION OF THE PREFERRED EMBODIMENT

In accordance with a preferred embodiment of the present invention, an epitaxial structure is provided for photoconductive purposes. The photoconductive structure is a modified PIN diode that is optimized for increased performance through an enhanced layer having a graded doping concentration. The particulars of the structure and method of manufacture of the present invention are discussed further herein.

Figure 1:
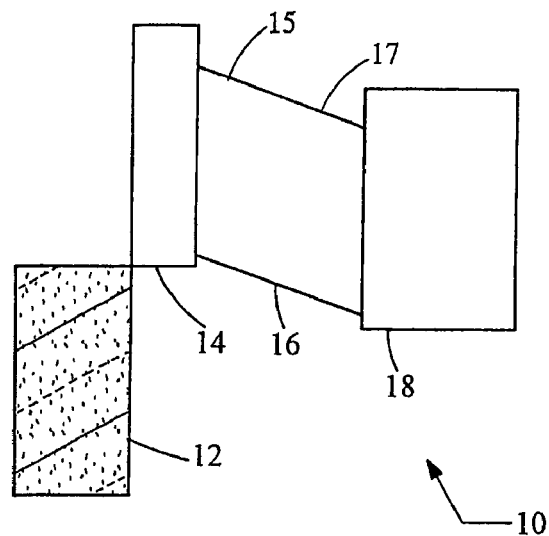
FIG. 1 is an energy band diagram of a pin photodiode in accordance with the present invention.

Referring to FIG. 1, an energy band diagram of a PIN photodiode 10 shows the relative energy levels of the semiconductor materials that form the photodiode 10. In particular, the photodiode 10 is comprised of a group of semiconductor materials, including a first p-type semiconductor layer 14, a second p-type semiconductor layer 16, and an n-type semiconductor layer 18. An anode layer 12 is shown adjacent to the first p-type semiconductor layer 14 to collect holes.

The first p-type semiconductor layer 14 is selected from a group comprising tertiary semiconductors, or group III–V semiconductors. Accordingly, the first p-type semiconductor layer 14 is either two elements from group III combined with one element from group V or the converse, two elements from group V combined with one element from group III. A table of representative groups of the periodic table is shown below.

| GROUP II | GROUP III | GROUP IV | GROUP V |
| --- | --- | --- | --- |
| Zinc (Zn) | Aluminum (Al) | Silicon (Si) | Phosphorus (P) |
| Cadmium (Cd) | Gallium (Ga) | Germanium (Ge) | Arsenic (As) |
| Mercury (Hg) | Indium (In) | | Antimony (Sb) |

In the preferred embodiment, the first p-type semiconductor layer 14 is InAlAs. However, it is understood that the first p-type semiconductor layer 14 may be any tertiary semiconductor that provides the necessary bandgap for optimized operation of the photodiode 10.

The n-type semiconductor layer 18 is also selected from a group comprising tertiary semiconductors, or group III–V semiconductors. As before, the n-type semiconductor layer 18 is either two elements from group III combined with one element from group V or the converse, two elements from group V combined with one element from group III. In the preferred embodiment, the n-type semiconductor layer 18 is InAlAs. However, it is understood that the n-type semiconductor layer 18 may be any tertiary semiconductor that provides the necessary bandgap for optimized operation of the photodiode 10.

The second p-type semiconductor layer 16 is also selected from a group comprising tertiary semiconductors, or group III–V semiconductors. In the preferred embodiment, the second p-type semiconductor layer 16 is InGaAs with a graded doping concentration. However, it is understood that the second p-type semiconductor layer 16 may be any tertiary semiconductor that provides the necessary low bandgap for optimized operation of the photodiode 10.

In order to achieve a graded doping concentration, the second p-type semiconductor layer 16 is not doped in a typical manner. In general, a p-type semiconductor is fabricated by using dopants with a deficiency of valence electrons, also known as acceptors. The p-type doping results in an abundance of holes. For example, in a type III–V semiconductor, some of the group III atoms may be replaced with atoms from group II, such as Zn or Cd, thereby producing a p-type material. Similarly, as group IV atoms act as acceptors for group V atoms and donors for group III atoms, a group IV doped III–V semiconductor will have an excess of both electrons and holes.

Figure 2:
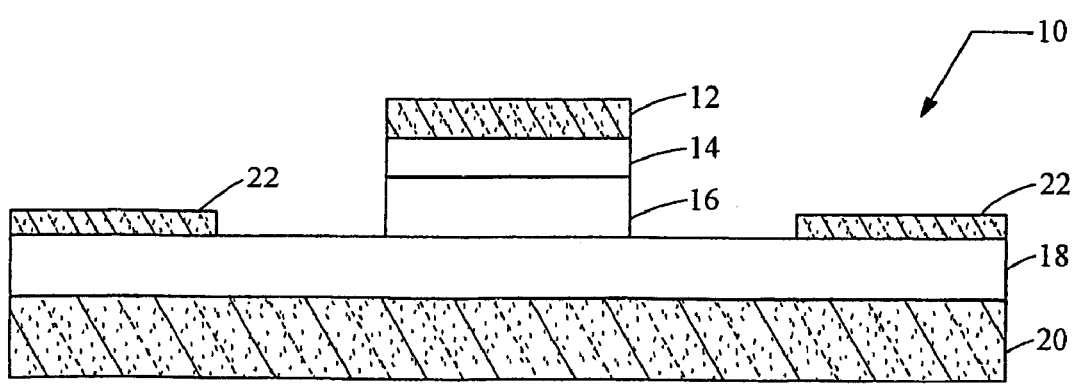
FIG. 2 is a cross-sectional view of a basic configuration of a pin photodiode in a surface illuminated structure in accordance with the present invention.

FIG. 2 is a cross-sectional view of a basic configuration of a photodiode 10 in a surface illuminated structure designed in accordance with the present invention. A substrate layer 20 is provided for growing the semiconductor structure. The n-type semiconductor layer 18 is deposited upon the substrate. The first p-type semiconductor layer 14 and the second p-type semiconductor layer 16 are deposited in a manner such that the second p-type semiconductor layer 16 is directly adjacent to the n-type semiconductor layer 18. As before, an anode layer 12 is deposited on the first p-type semiconductor layer 14 for collecting holes. Also shown is a cathode layer 22, or n-type contact layer, for collecting electrons.

As noted, it is a feature of the second p-type semiconductor layer 16 that it includes a graded doping concentration. The presence of dopants in the second p-type semiconductor layer 16 is controlled in order to optimize the performance of the photodiode. A first concentration 15 is located near the first p-type semiconductor 14, and a second concentration 17 is directly adjacent to the n-type semiconductor 18. Preferably, D is between 800 and 1,000 angstroms deep, i.e. the dimension parallel to the travel of the carriers.

Figure 4:
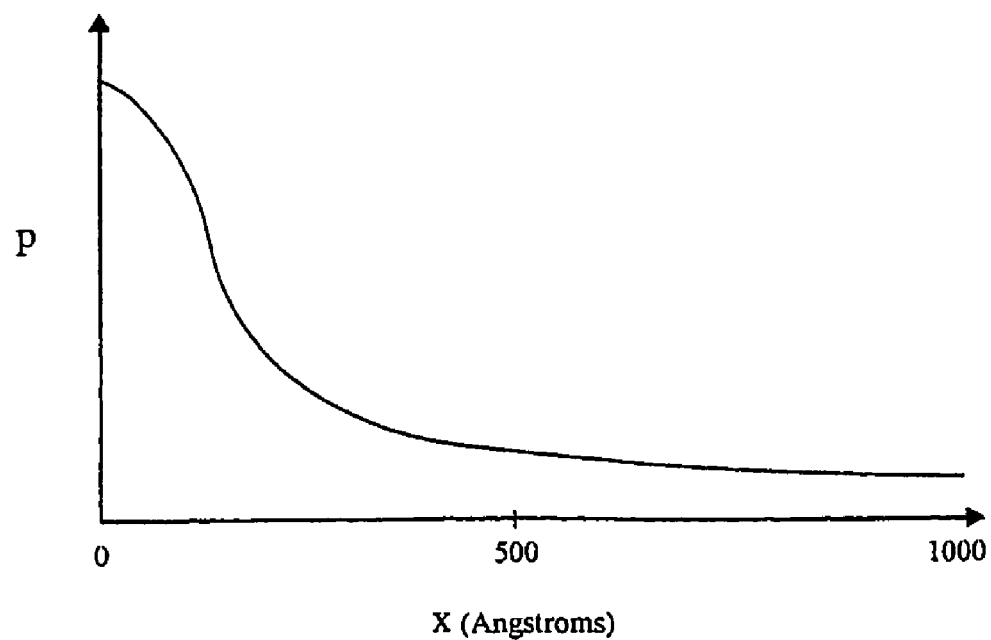
FIG. 4 is a graph representing the relationship between the doping concentration and the relative depth of a semiconductor layer of the present invention.

In the preferred embodiment, the first concentration 15 is greater than the second concentration 17. In particular, the first concentration 15 is located at a position $x_o$ and defines a dopant concentration $P_o$. A preferred doping concentration gradient is governed by the following equation:

$$p = p_o e^{\frac{-x}{D}} \quad (1)$$

over the depth D of the second p-type semiconductor layer 16 for all x and D greater than zero. A generic representation of the dopant concentration P is shown in FIG. 4.

The graded doping structure of the second p-type semiconductor layer 16 results in improved performance of the photodiode 10. During operation, incident light is absorbed in the second p-type semiconductor layer 16 of the photodiode 10. The light that is absorbed in the second concentration 17 part of the second p-type semiconductor layer 16 produces electrons and holes which drift to the anode 12 and cathode 22 under the influence of the large drift electric field. Although this is the usual situation in standard uniformly low doped absorber PIN photodetectors, in the present invention, the photoresponse of the carriers is more complex.

The electrons generated in the second concentration 17 part of the second p-type semiconductor layer 16 reach the cathode with their saturation velocity and are collected. The holes generated in the second concentration 17 part of the second p-type semiconductor layer 16 travel to the anode 12, thus entering the first concentration 15 where the concentration of dopants is relatively high and where they are collected, thus ending their transit time.

By way of comparison, the light that is absorbed in the first concentration 15 part of the second p-type semiconductor layer 16 also produces electrons and holes. In this case however, the holes are readily collected in the first concentration 15 and thus do not add substantially to the transit time of the carriers or reduce the bandwidth of the photodiode 10. Accordingly, insofar as the holes are concerned, the graded doping concentration of the photodiode 10 does not add to their transit time or reduce the detector bandwidth in either in the first concentration 15 or the second concentration 17.

Another aspect of the graded doping concentration of the second p-type semiconductor layer 16 is the creation of a pseudo-electric field. The electrons generated in the first concentration 15 region are subject to this pseudo-field shown below as $$E = -\left(\frac{kT}{q}\right)\frac{dp}{dx}\frac{1}{p}, \quad (2)$$

where k is Boltzman's constant, T is the temperature, q is the charge of an electron, and the value $$\frac{dp}{dx}$$

is the doping concentration gradient.

Figure 3:
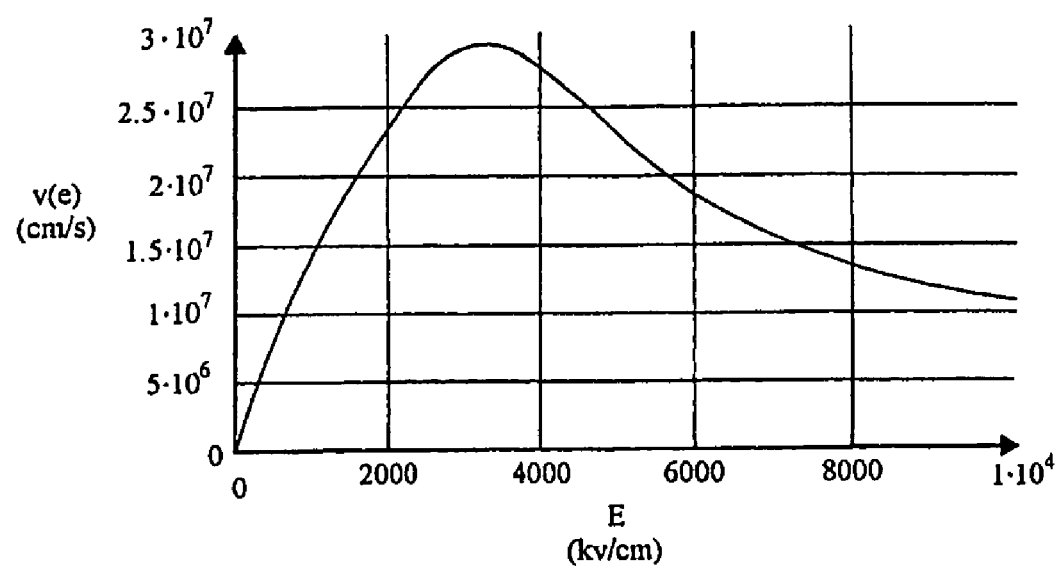
FIG. 3 is a graph representing the relationship between the electric field and the electron velocity according to an aspect of the present invention.

The pseudo-field E produces an "overshoot" electron velocity, i.e. the electron velocity is potentially many times faster than the saturation velocity. A typical electron saturation velocity is on the order of $5 \times 10^6$ cm/sec. However, the exponential gradient shown in Equation (1) with D=1,000 angstroms yields a field E=2.5 kV/cm, which corresponds to an electron overshoot velocity as large as $3 \times 10^7$ cm/sec. A graph depicting the relationship between the magnitude of the pseudo-field E and the electron velocity is shown in FIG. 3.

As described, the present invention improves upon the state of the art in photodiodes by implementing a graded doping concentration. In such a manner, the net absorption of a photodiode can be increased without substantially reducing the overall bandwidth of the device. It is further understood that it may be advantageous to optimize the overall speed by adjusting the doping concentration, the capacitance of the device, and the total thickness of the absorption region. It should be apparent to those skilled in the art that the above-described embodiments are merely illustrative of but a few of the many possible specific embodiments of the present invention. Numerous and various other arrangements can be readily devised by those skilled in the art without departing from the spirit and scope of the invention as defined in the following claims.

The invention claimed is:

1. A photodiode comprising:
   a semi-insulating substrate layer;
   a first p-type semiconductor layer;
   an n-type semiconductor layer; and
   a second p-type semiconductor layer disposed between the first p-type semiconductor layer and the n-type semiconductor layer, the second p-type semiconductor being directly adjacent to the n-type semiconductor, the second p-type semiconductor layer having a graded doping concentration along the path of the carriers, the graded doping concentration defines defining a first concentration adjacent to the first p-type semiconductor layer and a second concentration adjacent to the n-type semiconductor layer, the first concentration being greater than the second concentration.

2. The photodiode of claim 1 further comprising an anode layer for collecting holes.

3. The photodiode of claim 1 further comprising a cathode layer for collecting electrons.

4. The photodiode of claim 1 wherein the first p-type semiconductor layer is InAlAs.

5. The photodiode of claim 1 wherein the n-type semiconductor layer is InAlAs.

6. The photodiode of claim 1 wherein the second p-type semiconductor layer is InGaAs.

7. A photodiode comprising:
   a first p-type semiconductor layer;
   an n-type semiconductor layer; and
   a second p-type semiconductor layer disposed between the first p-type semiconductor layer and the n-type semiconductor layer such that the second p-type semiconductor is directly adjacent to the n-type semiconductor, the second p-type semiconductor layer having a graded doping concentration,
   the graded doping concentration defining a first concentration adjacent to the first p-type semiconductor layer and a second concentration adjacent to the n-type semiconductor layer, the first concentration being greater than the second concentration, and
   the first concentration being located at a position $x_o$ and defining a concentration $P_o$, and the graded doping concentration being governed by the following equation:

$$p = p_o e^{\frac{-x}{D}}$$

over the depth D of the second p-type semiconductor layer for all x and D greater than zero.

8. The photodiode of claim 7 wherein the depth, D, for the first concentration is between 800 and 1000 angstroms in length.

9. A method of fabricating a photodiode comprising:
   providing a substrate layer;
   depositing an n-type semiconductor layer on the substrate;
   depositing a second p-type semiconductor layer having a p-type dopant on the n-type semiconductor layer;
   grading the p-type dopant of the second p-type semiconductor layer from a first concentration to a second concentration, the first concentration being greater than the second concentration; and
   depositing a first p-type semiconductor layer on the second p-type semiconductor layer, the second p-type semiconductor layer being between the first p-type semiconductor layer and the n-type semiconductor layer such that the second concentration is directly adjacent to the n-type semiconductor layer.

10. The method of claim 9 further comprising the step of affixing an anode to collect holes.

11. The method of claim 9 further comprising the step of affixing a cathode to collect electrons.

12. The method of claim 9 wherein the first p-type semiconductor layer is InAlAs.

13. The method of claim 9 wherein the n-type semiconductor layer is InAlAs.

14. The method of claim 9 wherein the second p-type semiconductor layer is InGaAs.

15. A method of fabricating a photodiode comprising:
   providing a substrate layer;
   depositing an n-type semiconductor layer on the substrate;
   depositing a second p-type semiconductor layer having a p-type dopant on the n-type semiconductor layer;
   grading the p-type dopant of the second p-type semiconductor layer from a first concentration to a second concentration, wherein the first concentration is greater than the second concentration; and
   depositing a first p-type semiconductor layer on the second p-type semiconductor layer, wherein the second p-type semiconductor layer is between the first p-type semiconductor layer and the n-type semiconductor layer such that the second concentration is directly adjacent to the n-type semiconductor layer, and
   wherein the first concentration is located at a position $x_o$ and defines a concentration $P_o$, and further wherein the graded doping concentration is governed by the following equation:

$$p = p_o e^{\frac{-x}{D}}$$

over the depth D of the second p-type semiconductor layer for all x and D greater than zero.

16. A photodiode having a first p-type semiconductor layer and an n-type semiconductor layer comprising:
   a second p-type semiconductor layer disposed between the first p-type semiconductor layer and the n-type semiconductor layer such that the second p-type semiconductor is directly adjacent to the n-type semiconductor, the second p-type semiconductor layer having a graded doping concentration, wherein the graded doping concentration is governed by the following equation:

$$p = p_o e^{\frac{-x}{D}}$$

over the depth D of the second p-type semiconductor layer for all x and D greater than zero.

17. The photodiode of claim 16 wherein the second p-type semiconductor layer is a type III–V semiconductor.

18. The photodiode of claim 16 wherein the second p-type semiconductor layer is InGaAs.

* * * * *

UNITED STATES PATENT AND TRADEMARK OFFICE
CERTIFICATE OF CORRECTION

PATENT NO.         : 7,078,741 B2                                                   Page 1 of 1
APPLICATION NO. : 10/502109
DATED              : July 18, 2006
INVENTOR(S)        : Cheng C. Ko et al.

It is certified that error appears in the above-identified patent and that said Letters Patent is hereby corrected as shown below:

Column 5, in claim 4, line 2, delete "InA1As" and substitute --InAlAs-- in its place.

Column 5, in claim 5, line 2, delete "InA1As" and substitute --InAlAs-- in its place.

Column 5, in claim 7, line 16, delete "$P_o$," and substitute --$p_o$,-- in its place.

Column 6, in claim 12, line 2, delete "InA1As" and substitute --InAlAs-- in its place.

Column 6, in claim 13, line 2, delete "InA1As" and substitute --InAlAs-- in its place.

Column 6, in claim 15, line 17, delete "$P_o$," and substitute --$p_o$,-- in its place.

Signed and Sealed this

Twenty-sixth Day of December, 2006

JON W. DUDAS
*Director of the United States Patent and Trademark Office*